United States Patent

Jin

[11] Patent Number: 6,028,005
[45] Date of Patent: Feb. 22, 2000

[54] METHODS FOR REDUCING ELECTRIC FIELDS DURING THE FABRICATION OF INTEGRATED CIRCUIT DEVICES

[75] Inventor: Yong-suk Jin, Kyungki-do, Rep. of Korea

[73] Assignee: Samsung Electronics Co., Ltd., Rep. of Korea

[21] Appl. No.: 08/711,250

[22] Filed: Sep. 10, 1996

[30] Foreign Application Priority Data

Dec. 22, 1995 [KR] Rep. of Korea ................ 95-54725

[51] Int. Cl.⁷ .................................................. H01L 21/44
[52] U.S. Cl. .................... 438/666; 438/585; 438/652
[58] Field of Search ................ 438/585, 4, 652, 438/666

[56] References Cited

U.S. PATENT DOCUMENTS

| | | | |
|---|---|---|---|
| 4,990,980 | 2/1991 | Wada | 257/302 |
| 5,424,857 | 6/1995 | Aoki et al. | 359/59 |
| 5,612,546 | 3/1997 | Choi et al. | 257/66 |
| 5,717,254 | 2/1998 | Hashimoto | 257/773 |
| 5,828,101 | 10/1998 | Endo | 257/330 |

*Primary Examiner*—John F. Niebling
*Assistant Examiner*—John Murphy
*Attorney, Agent, or Firm*—Myers Bigel Sibley & Sajovec

[57] ABSTRACT

A method for fabricating an integrated circuit device includes the steps of forming first and second conductive regions on a substrate. The second conductive region is divided into first and second subregions wherein the first subregion is adjacent the first conductive region. More particularly, the surface area of the first subregion is not more than ten times greater than the surface area of the first conductive region. The first and second subregions can then be electrically connected to complete the second conductive region. Related structures are also discussed.

12 Claims, 3 Drawing Sheets

METHODS FOR REDUCING ELECTRIC FIELDS DURING THE FABRICATION OF INTEGRATED CIRCUIT DEVICES

FIELD OF THE INVENTION

The present invention relates to the field of microelectronics and more particularly to integrated circuit devices.

BACKGROUND OF THE INVENTION

As integrated circuit devices become more highly integrated, the distances between circuits formed on a semiconductor wafer are reduced. Accordingly, patterned layers formed on the semiconductor substrate have reduced spaces therebetween. When implanting such patterned layers, charge may accumulate on the structures of the patterned layer. This "charge-up" phenomenon may result in electric fields which damage the structures of these finely patterned layers. Anisotropic etching processes may also result in damaging charge accumulation. In particular, the thin insulating films used in polysilicon thin film transistor LCD processes can be readily damaged as a result of the "charge-up" phenomenon.

When ions are implanted into a wafer, the implanted ions collide with atoms of the wafer generating secondary electrons which are emitted from the wafer. The number of secondary electrons emitted varies according to the composition and the physical configuration of the wafer. In general, a larger number of secondary electrons are emitted from a conductor than from an insulator, and the number of secondary electrons emitted increases as the area of the structure increases. Referring to FIG. 1, for example, the number of secondary electrons emitted from the patterned polysilicon layers A and B is approximately two to four times greater than the number of secondary electrons emitted from the patterned oxide layer C.

While each of the patterned polysilicon layers A and B and the patterned oxide layer C are positively charged, the charge of polysilicon layer B is greater than that of polysilicon layer A because of the difference in the surface areas of the layers. Accordingly, a potential difference is generated between polysilicon layers A and B. The electric field resulting from this potential difference may be relatively strong when the two charged polysilicon layers are closely spaced.

The oxide layers C and the active region D between the charged polysilicon layers A and B may thus be affected by the electric field. If the electric field is strong enough, electrons from the oxide pattern C and the active region D may migrate to the polysilicon layers A and B. Furthermore, electrons from the active region D may be more easily subjected to migration than electrons from a nonconductive substrate E such as a quartz substrate. This migration of electrons may result in a deterioration of the oxide layer C and may even lead to the formation of a short circuit between the polysilicon layers A and B and the active region D.

In order to reduce damage resulting from this "charge-up" phenomenon, there have been proposed methods for showering the semiconductor structure with electrons after performing the ion implantation. Although this process can neutralize the charge of the structure, thus reducing the effects of charge-up, damage may still occur.

The layout of a semiconductor device which has been damaged as a result of the "charge-up" phenomenon is illustrated in FIG. 2. A long conductive pattern 14 and a short conductive pattern 10 are arranged adjacent to an active region 12. When ions are implanted into a substrate having such a structure, secondary electron emission may occur, and the long and short conductive patterns 14 and 10 may become positively charged. Because the charge on the longer conductive pattern 14 (with a larger surface area) is greater than that of the shorter conductive pattern 10 (with a smaller surface area), a potential difference is generated between the conductive patterns 10 and 14. The electric field resulting from this potential difference is strongest where the conductive patterns are most closely spaced.

An insulating film may be located between the active region 12 and the conductive patterns 10 and 14. Portions of the active region 12 and the insulating film are thus located within the strongest portions of the electric field between the conductive patterns 10 and 14. The insulating film may be relatively thin, and more particularly, may be thinner than the space between the conductive patterns 10 and 14. Electrons from the insulating film and the active region 12 may thus migrate to the conductive patterns 10 and 14 under the influence of the electric field.

The electric field may be directed from the longer pattern 14 toward the shorter pattern 10 with the electrons migrating toward the longer conductive pattern 14. If the distance between the conductive patterns 10 and 14 is relatively short, an electric field with sufficient strength to damage the insulating film may be generated. Accordingly, the conductive patterns 10 and 14 may be connected to the active region 12 through damaged portions of the insulating film. Because the active region 12 is conductive, the conductive patterns 10 and 14 are thus shorted. Even if not shorted, the migration of electrons from the active area to the conductive patterns may result in a decreased conductivity of the active region.

As discussed above, the insulating film of a conventional semiconductor device may be damaged due to the "charge-up phenomenon". The resulting short circuits may reduce the yield of the semiconductor devices thus produced.

SUMMARY OF THE INVENTION

It is therefore an object of the present invention to provide improved integrated circuit methods and structures.

It is another object of the present invention to provide methods and structures for reducing damage due to the "charge-up" phenomenon.

It is still another object of the present invention to provide methods and structures for increasing yields of semiconductor devices.

These and other objects of the present invention are provided by a method for fabricating an integrated circuit device including the steps of forming first and second conductive regions on a substrate. The second conductive region is divided into first and second subregions, and the first subregion is adjacent the first conductive region. Furthermore, the surface area of the first subregion is not more than ten times greater than the surface area of the first conductive region. The first and second subregions are then electrically connected to complete the second conductive region. Accordingly, the substrate can be processed with adjacent conductive regions having approximately equal size, with conductive subregions being connected at a later time.

More particularly, the step of electrically connecting the subregions can be preceded by the step of bombarding an ion stream on the first and second conductive regions. The charge accumulated on the first subregion and the charge accumulated on the first conductive region are not so different that a damaging electric field is generated therebetween. More particularly, the bombarding step can include implanting a stream of ions. Damage due to the "charge-up" phenomenon during ion implantation can thus be reduced.

The first and second conductive regions may be patterned layers of polysilicon. More particularly, these conductive regions may define gate electrodes of one or more field effect transistors. The steps of forming the first and second conductive regions may be preceded by the steps of forming an active portion of the substrate and forming an insulating layer on the active portion of the substrate. In particular, the first conductive region and the first subregion of the second conductive region can be formed on the insulating layer opposite the active portion of the substrate. In addition, the first and second subregions may define a conductive line and the electrically connecting step may include forming a metal connection between the first and second subregions.

A method of the present invention thus allows relatively long conductive lines to be formed adjacent relatively short conductive lines and implanted without causing significant damage as a result of the charge-up phenomenon. In particular, relatively long conductive lines can be divided into conductive subregions which are then connected with metal lines after implanting. This method thus increases the yield of integrated circuit devices formed thereby.

DETAILED DESCRIPTION

Figure 1:
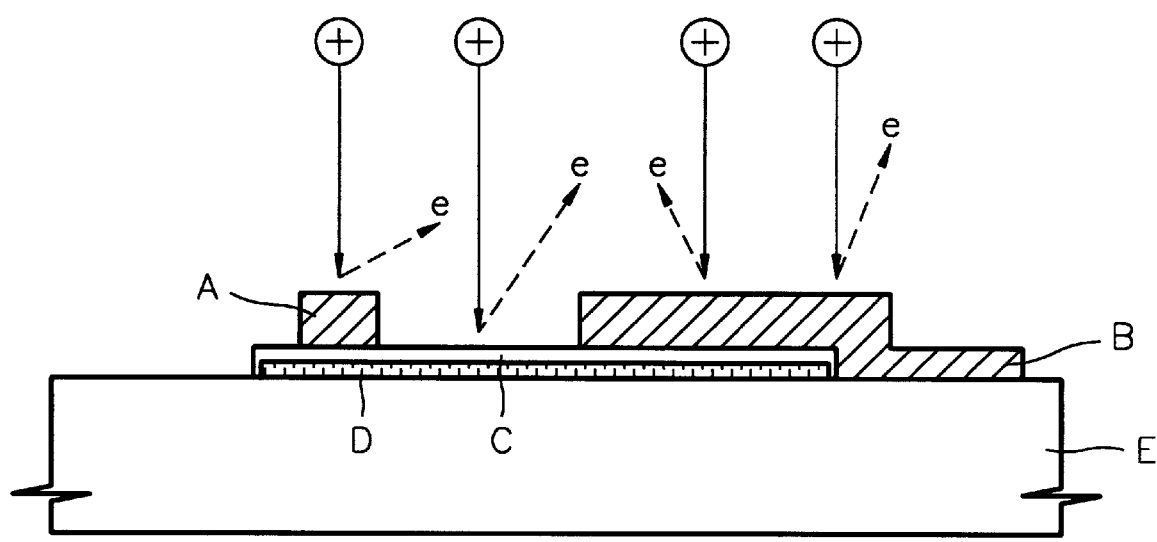
FIG. 1 is a cross-sectional view illustrating the effect of the "charge-up" phenomenon on a semiconductor device according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
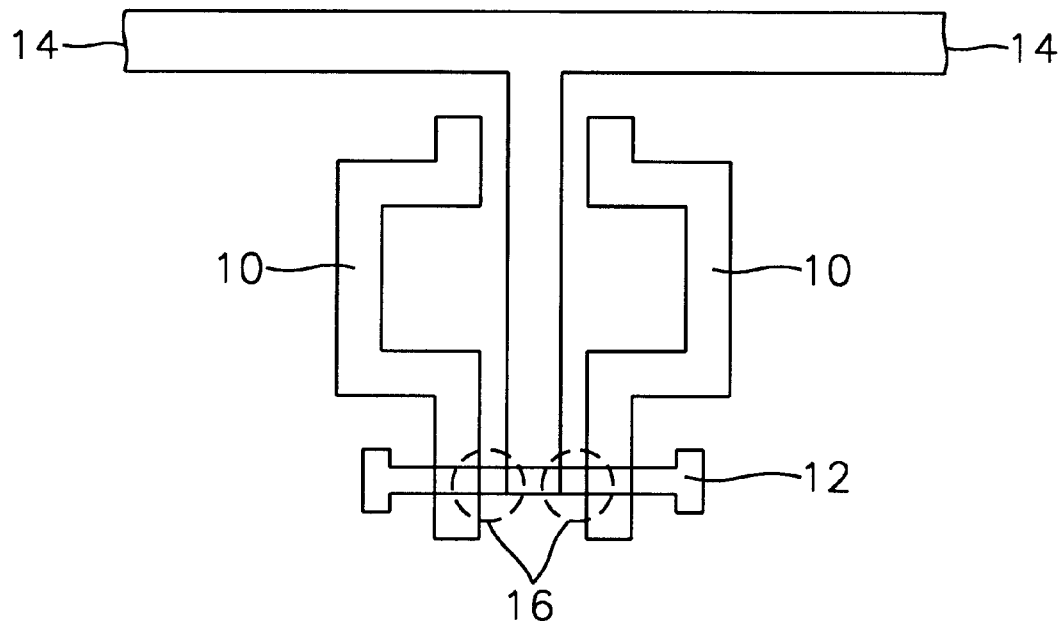
FIG. 2 is a plan view illustrating a partial layout of a semiconductor device according to the prior art which has been damaged as a result of the "charge-up" phenomenon.
Figure 3:
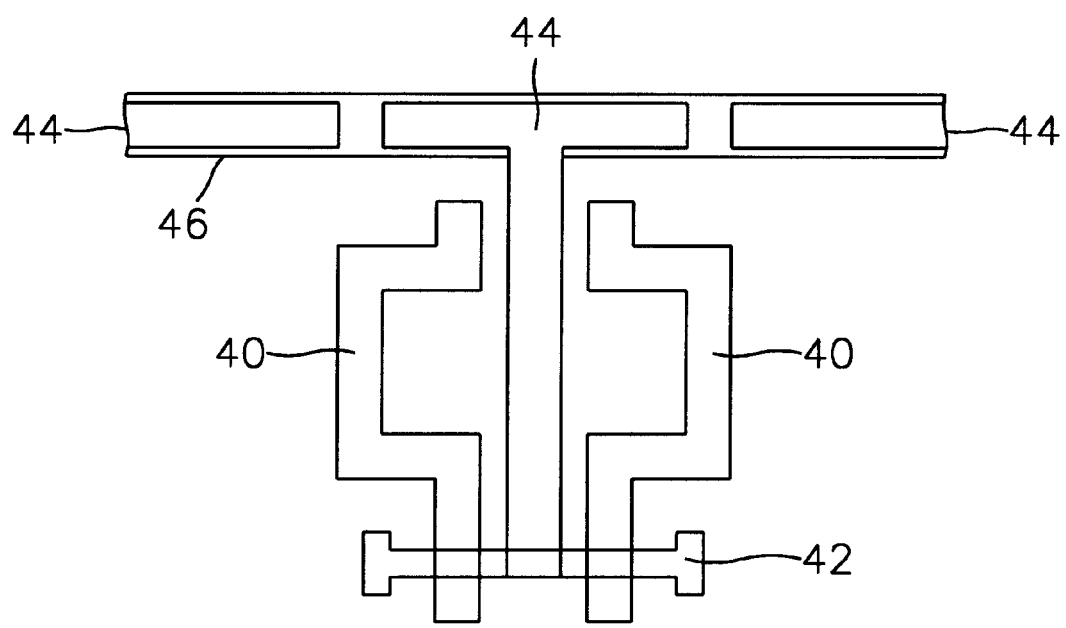
FIG. 3 is a plan view illustrating a partial layout of a semiconductor device according to the present invention.

In order to describe the present invention, the layout of the semiconductor device of FIG. 2 has been redesigned as shown in FIG. 3. In particular, the relatively long conductive region 14 of FIG. 2 having a large surface area relative to that of the conductive region 10 is divided into shorter subregions or segments. In particular, the longer region is divided into subregions 44 so that the conductive region 44 adjacent the conductive region 40 does not accumulate an excessive charge relative to that accumulated on the adjacent conductive region 40. More particularly, a ratio of the surface area of the long conductive subregion 44 to a surface area of the shorter conductive region 40 does not exceed 10:1. Accordingly, the conductive regions 40 and the conductive subregions 44 accumulate comparable charges resulting in similar potentials, thus reducing the intensity of the electric field generated therebetween. The active region 42, which is adjacent the conductive regions 40 and 44, thus experiences an electric field having roughly equal intensities from the conductive region 40 and the conductive subregion 44. Electron migration from the insulating film and the active region 42 to the conductive regions 40 and the conductive subregion 44 is thus reduced.

Damage to the insulating layer adjacent the conductive regions 40 and the conductive subregion 44 can be reduced. Electrical contact between the conductive regions 40 and the conductive subregion 44 and the active region 42 can thus be prevented. Accordingly, short circuits between the conductive regions 40 and the conductive subregions 44 can be reduced thus increasing the yield of the semiconductor device. The divided conductive subregions 44 are then connected using the illustrated metal wiring 46. Accordingly, the connected conductive subregions 44 provide a continuous conductive pattern.

Figure 4:
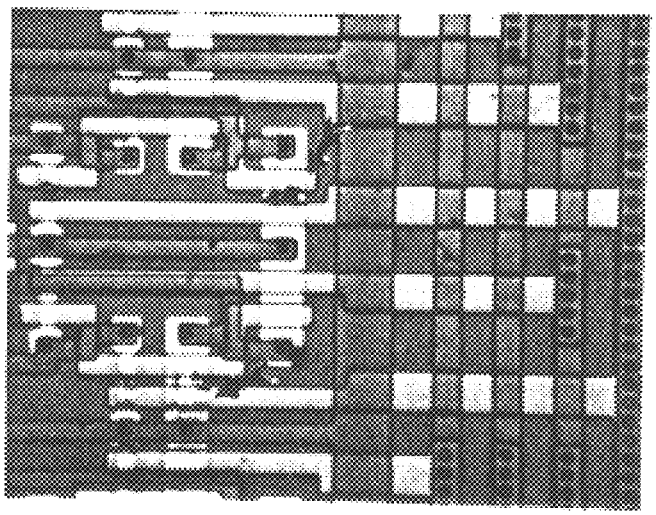
FIG. 4 is a photograph of a semiconductor device fabricated according to the prior art.

FIG. 4 is a photograph illustrating the layout of a semiconductor device according to the prior art which has been damaged due to the "charge-up" phenomenon. Damaged portions of the active region are indicated by arrows, and this damage is due to differences in the lengths of gate lines G.

Figure 5:
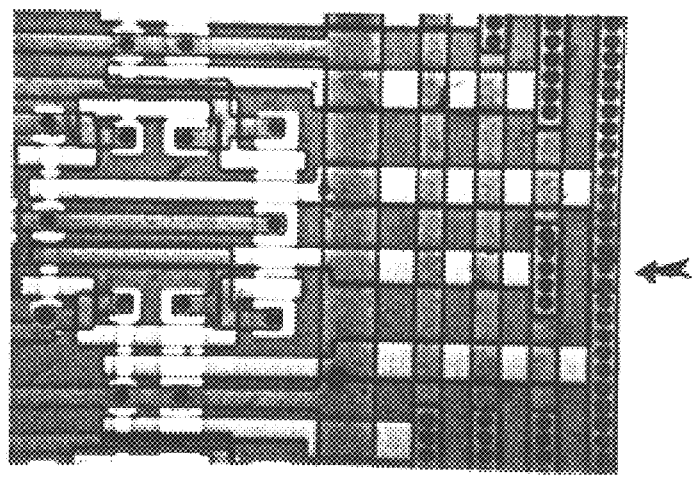
FIG. 5 is a photograph of a semiconductor device according to the present invention.
Figure 5:

The photograph of FIG. 5 illustrates a semiconductor device according to the present invention with a gate line which is divided as indicated by the arrows. The differences in the length of adjacent conductive regions is smaller than that provided by devices of the prior art. Stated in other words, a ratio of areas of adjacent conductive regions is reduced when compared to ratios of prior art devices where gate lines are not divided. Damage resulting from the "charge-up phenomenon" (which is illustrated in FIG. 4) is thus reduced.

According to the present invention, conductive regions having a relatively large surface area are divided into a plurality of subregions so as to reduce a ratio of surface areas of adjacent conductive regions. Accordingly, even though conductive regions and subregions on the semiconductor device may be electrically charged due to the "charge-up phenomenon", this charge is relatively uniformly distributed across the conductive regions and subregions, and any resulting imbalance of potential difference is relatively small. Short circuits occurring between conductive regions due to damage to the insulating films can thus be greatly reduced. As a result, the yield of the semiconductor devices can be significantly increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for fabricating a semiconductor device, said method comprising the steps of:

forming a first conductive region on a substrate;

forming a second conductive region on said substrate, wherein said second conductive region comprises first and second subregions that are insulated from one another, wherein said first subregion is adjacent said first conductive region, and wherein the surface area of said first subregion is not more than 10 times greater than the surface area of said first conductive region;

after forming said first conductive region and after forming said second conductive region including said first and second subregions, bombarding an ion stream on said substrate; and after forming said first conductive region, after forming said second conductive region including said first and second subregions, and after bombarding the ion stream on said substrate, electrically connecting said first and second subregions to complete said second conductive region so that said bombarding step is between said steps of forming said first and second conductive regions and said step of electrically connecting said first and second subregions.

2. The method according to claim 1 wherein said bombarding step comprises implanting said stream of ions.

3. The method according to claim 1 wherein said first and second conductive regions each comprise a patterned layer of polysilicon.

4. The method according to claim 3 wherein said second conductive region defines a gate electrode.

5. The method according to claim 1 wherein said steps of forming said first and second conductive regions are preceded by the steps of:

forming an active portion of said substrate; and forming an insulating layer on said active portion of said substrate wherein said first conductive region and said first subregion of said second conductive region are formed on said insulating layer opposite said active portion of said substrate.

6. The method according to claim 1 wherein said first and second subregions of said second conductive region define a conductive line.

7. The method according to claim 1 wherein said electrically connecting step comprises forming a metal connection between said first and second subregions.

8. The method according to claim 1 wherein said step of electrically connecting said first and second subregions comprises forming a metal wiring layer thereon.

9. The method according to claim 1 wherein said first and second subregions comprise patterned polysilicon layers.

10. The method according to claim 1 wherein said step of forming said second conductive region comprises bombarding an ion stream on said second conductive region.

11. The method according to claim 1 wherein said steps of forming said first and second conductive regions are performed simultaneously and wherein said steps of forming said first and second conductive regions comprises bombarding an ion stream on said first and second conductive regions.

12. The method according to claim 1 wherein the surface area of said first subregion is approximately equal to the surface area of said first conductive region.

* * * * *